United States Patent
Harper

(10) Patent No.: US 7,705,756 B2
(45) Date of Patent: Apr. 27, 2010

(54) MULTI-CHANNEL ANALOG-TO-DIGITAL CONVERTER

(75) Inventor: Marcellus C. Harper, Kaysville, UT (US)

(73) Assignee: Slicex, Inc., Draper, UT (US)

( * ) Notice: Subject to any disclaimer, the term of this patent is extended or adjusted under 35 U.S.C. 154(b) by 2 days.

(21) Appl. No.: 11/933,527

(22) Filed: Nov. 1, 2007

(65) Prior Publication Data

US 2008/0106448 A1    May 8, 2008

Related U.S. Application Data

(60) Provisional application No. 60/856,636, filed on Nov. 3, 2006.

(51) Int. Cl.
*H03M 1/00* (2006.01)

(52) U.S. Cl. ..................... 341/141; 704/500

(58) Field of Classification Search .......... 341/122–155
See application file for complete search history.

(56) References Cited

U.S. PATENT DOCUMENTS

| | | | |
|---|---|---|---|
| 5,206,602 A * | 4/1993 | Baumgartner et al. ......... 330/9 |
| 5,293,169 A * | 3/1994 | Baumgartner et al. ....... 341/172 |
| 5,329,281 A * | 7/1994 | Baumgartner et al. ....... 341/139 |
| 5,337,230 A * | 8/1994 | Baumgartner et al. ......... 700/9 |
| 5,382,956 A * | 1/1995 | Baumgartner et al. ....... 341/155 |
| 5,467,090 A * | 11/1995 | Baumgartner et al. ....... 341/155 |
| 6,675,125 B2 * | 1/2004 | Bizjak ........................ 702/179 |
| 6,778,966 B2 * | 8/2004 | Bizjak ........................ 704/500 |
| 7,027,961 B2 * | 4/2006 | Molenaar .................... 702/193 |
| 7,126,515 B1 * | 10/2006 | Kris ........................... 341/141 |
| 7,190,292 B2 * | 3/2007 | Bizjak ........................ 341/139 |
| 7,613,901 B2 * | 11/2009 | Alfano et al. ................. 712/37 |
| 2005/0040978 A1 | 2/2005 | Morita et al. |
| 2005/0134490 A1 | 6/2005 | Cox |
| 2005/0231413 A1 | 10/2005 | Ogawa |
| 2006/0038711 A1 | 2/2006 | Chou et al. |
| 2006/0187107 A1 | 8/2006 | Kurose et al. |
| 2007/0195024 A1 * | 8/2007 | Korcharz et al. .............. 345/82 |
| 2007/0195025 A1 * | 8/2007 | Korcharz et al. .............. 345/82 |
| 2008/0048573 A1 * | 2/2008 | Ferentz et al. ............... 315/193 |
| 2008/0238750 A1 * | 10/2008 | Kris et al. ................... 341/155 |

* cited by examiner

*Primary Examiner*—Lam T Mai
(74) *Attorney, Agent, or Firm*—Steven L. Nichols

(57) ABSTRACT

A system for multi-channel analog-to-digital conversion has a plurality of sampling modules, wherein each of the modules includes an input node and an output node; multiplexing circuitry configured to selectively route at least one of a plurality of electrical signals present on the output nodes to an analog-to-digital converter; and control circuitry in communication with the multiplexing circuitry, wherein the control circuitry is programmatically configured to control a sequence in which the electrical signals are routed to the analog-to-digital converter.

21 Claims, 7 Drawing Sheets

|       | Ch. 1 | Ch. 2 | Ch. 3 | Ch. 4 |
|-------|-------|-------|-------|-------|
| Row 1 | 1     | 1     | 1     | 1     |
| Row 2 |       |       |       |       |
| Row 3 |       |       |       |       |
| Row 4 |       |       |       |       |

FIG. 3

|       | Ch. 1 | Ch. 2 | Ch. 3 | Ch. 4 |
|-------|-------|-------|-------|-------|
| Row 1 | 249   | 1     | 0     | 0     |
| Row 2 | 249   | 0     | 1     | 0     |
| Row 3 | 249   | 0     | 0     | 1     |
| Row 4 |       |       |       |       |

FIG. 4

| CMD Code | Action |
| --- | --- |
| 000 | Sample Ch. 1 |
| 001 | Sample Ch. 2 |
| 010 | Sample Ch. 3 |
| 011 | Sample Ch. 4 |
| 100 | Sleep |
| 101 | Calibrate |
| 110 | Pause |
| 111 | Stop |

*FIG. 6*

MULTI-CHANNEL ANALOG-TO-DIGITAL CONVERTER

RELATED APPLICATION

The present application claims priority under 35 U.S.C. § 119(e) to U.S. Provisional Patent Application No. 60/856,636, by Marcellus Harper, filed on Nov. 3, 2006, and entitled "Multi-Channel Analog-to-Digital Converter", which is incorporated herein by reference in its entirety.

BACKGROUND

In electronic systems, mixed-signal circuitry uses both analog and digital electrical signals to accomplish certain tasks. Often in these types of systems, it is necessary to convert from one type of signal to another, such as from an analog signal to a digital signal. For example, an analog electrical signal from a sensor may require conversion into a digital electrical signal to be properly analyzed or processed by a digital processor.

Analog-to-digital converters (ADCs) are commonly used to convert continuous analog signals to discrete digital values. Analog-to-digital converters are often configured to compare the voltage of an input signal to a number of reference voltages to determine which reference voltage is closest to the value of the input. A digital representation of the input signal is then created based on a series of such voltage comparisons.

In some alternative arrangements, an ADC may be configured to operate in terms of current. In other words, the current of an input signal may be compared to a set of current references to determine which reference current is closest to the input current. A digital representation of the input signal is then created based on a series of such current comparisons.

BRIEF DESCRIPTION OF THE DRAWINGS

The accompanying drawings illustrate various embodiments of the principles described herein and are a part of the specification. The illustrated embodiments are merely examples and do not limit the scope of the disclosure.

FIG. 3 illustrates an exemplary programmable configuration table that may be used to control the operation of the input sequencer block according to principles described herein.

FIG. 4 illustrates another exemplary programmable configuration table in which three different sampling schemes are specified according to principles described herein.

FIG. 6 illustrates an exemplary mapping of control codes that may be used in connection with the configuration table of FIG. 5 according to principles described herein.

Throughout the drawings, identical reference numbers designate similar, but not necessarily identical, elements.

DETAILED DESCRIPTION

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

As mentioned above, analog-to-digital converters (ADCs) are commonly used to convert continuous analog signals to discrete digital values. Analog-to-digital converters are often configured to compare the voltage of an input signal to a number of reference voltages to determine which reference voltage is closest to the value of the input. A digital representation of the input signal is then created based on a series of such voltage comparisons.

In some alternative arrangements, an ADC may be configured to operate in terms of current. In other words, the current of an input signal may be compared to a set of current references to determine which reference current is closest to the input current. A digital representation of the input signal is then created based on a series of such current comparisons.

It is often desirable for an ADC to accept multiple inputs. In other words, it is often desirable for an ADC to convert different input analog signals to corresponding digital representations at the same time.

Hence, in some examples, an ADC may be configured to have multiple input channels wherein input signals from different sources may be converted to digital representations. Conventional ADCs with a plurality of multiplexed inputs are configured to sample each of the channels coupled thereto in succession. However, there are instances where a user may desire to vary the order in which the channels are sampled. For example, the order in which it is desired that the channels be sampled may be dependent on the greater need for updated readings from one channel in comparison with other channels. In other cases, some of the channels may not be connected to any data source of consequence, thereby making it desirable to forego sampling these channels in favor of more frequent samplings of more significant channels.

Hence, the present specification describes a multi-channel ADC, in which the sampling order of the various channels may be selectively altered. The multi-channel ADC described herein may additionally or alternatively be used to sample a number of channels simultaneously.

Figure 1:
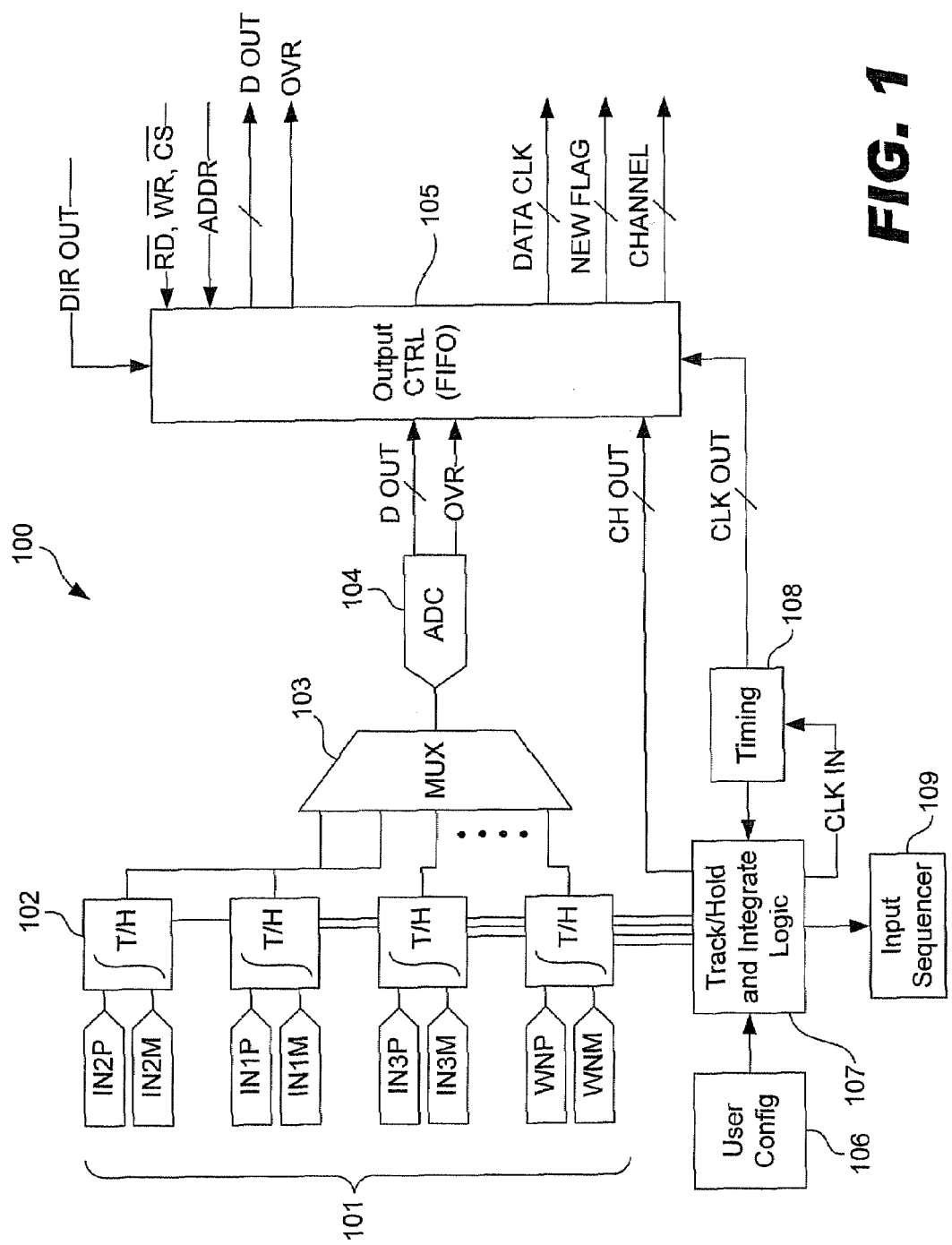
FIG. 1 illustrates an exemplary multi-channel analog-to-digital converter according to principles described herein.

FIG. 1 illustrates an exemplary multi-channel ADC (100) that may be used in accordance with the systems and methods described herein. As shown in FIG. 1, the multi-channel ADC (100) may include a plurality of inputs (101) each going into a corresponding track-and-hold block (102). The track-and-hold blocks (102) may also be referred to as sample-and-hold blocks. It will be recognized that any number of inputs (101) and corresponding track-and-hold blocks (102) may be included within the multi-channel ADC (100) as best serves a particular application.

Each of the track-and-hold blocks (102) may include any suitable combination of circuitry configured to perform any function as best serves a particular application. For example, as shown in FIG. 1, each of the track-and-hold blocks (102) may be configured to be integrating track-and-hold blocks (102).

Figure 2:
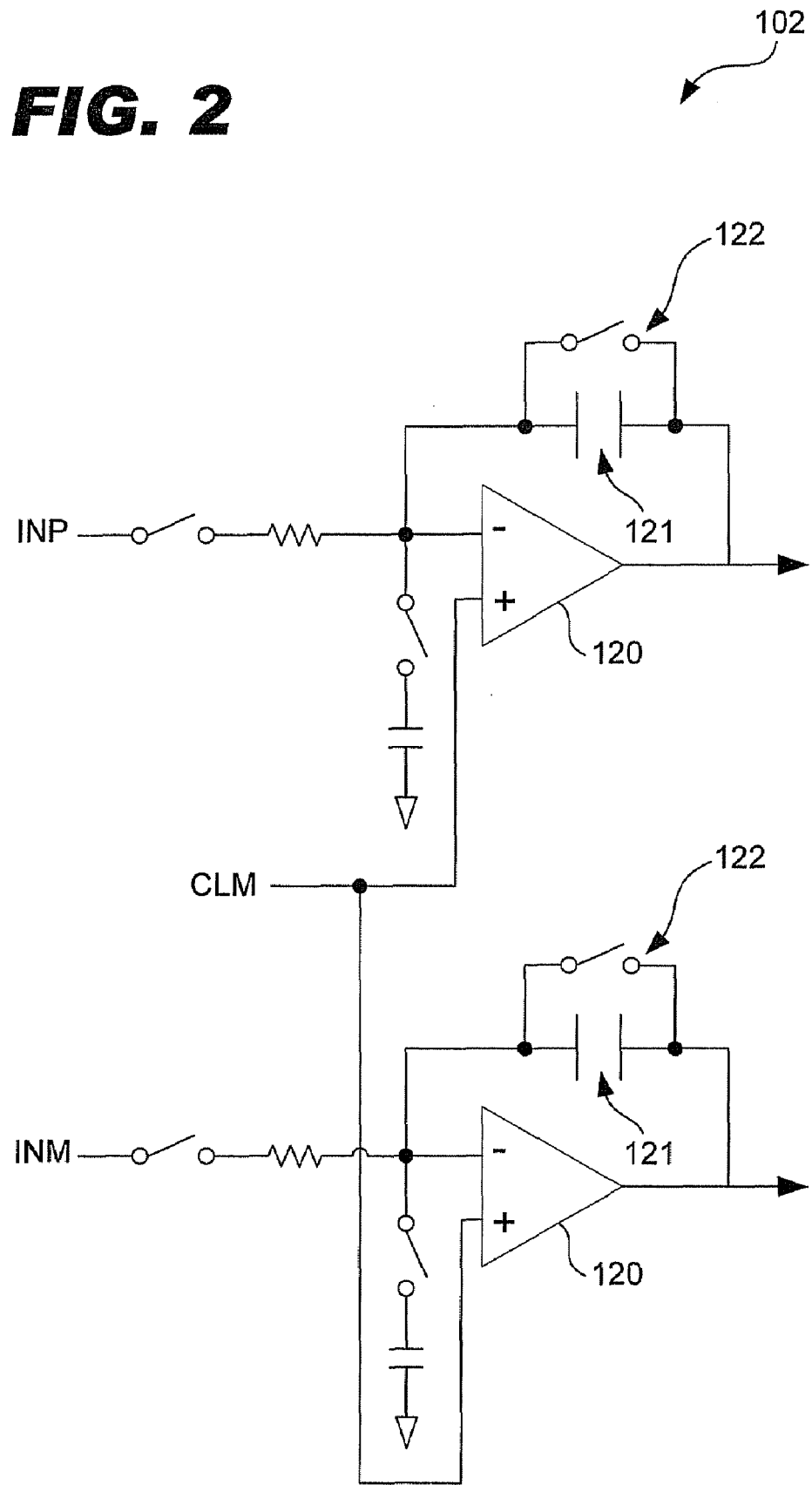
FIG. 2 illustrates a number of exemplary components that may be included within an integrating track-and-hold block according to principles described herein.

FIG. 2 illustrates a number of exemplary components that may be included within an integrating track-and-hold block (102). This can be used to effectively limit the bandwidth and noise of the incoming signal. Both capacitors (121) and op-amps (120) have frequency-related characteristics, and can therefore be used in combination to create signal filters that attenuate undesired incoming signal elements and noise (i.e. those signal elements of certain frequencies or ranges of frequencies falling outside of the range of frequencies permitted by the filter). As shown in FIG. 2, each track-and-hold block (102) may include two differential inputs INP and INM. Each input goes into a corresponding op-amp (120). Capacitors (121) may be connected to the negative input of each op-amp (120) and to the output of each op-amp (120). These capacitors (121) may be configured to be integrating capacitors in some examples.

Also shown in FIG. 2 is a switch (122) configured to bypass each capacitor (121). The switches (122) may be transistors, such as field effect transistors or bipolar junction transistors, and may be electronically controlled by the track/hold and integrate logic (107) or another source. In some cases it may be desirable to reset the integration function of the track and hold block (102, FIG. 1), such as when a new sample is being acquired. These switches (122) may be closed using a control signal, thereby forcing the track-and-hold inputs to look symmetrical and thereby reset the integration function. Various other resistors, capacitors, and switches may also be included within each track-and-hold block (102) as best serves a particular application.

Returning to FIG. 1, the output of each track-and-hold block (102) is input into a multiplexer (MUX) (103). The MUX (103) is configured to combine and/or route each of the outputs of the track-and-hold blocks (102) into a single output that is input into a core ADC (104). The core ADC (104) is configured to convert the analog inputs into corresponding digital signals or representations using any suitable method as best serves a particular application. Generally this conversion is done using a network of comparators, reference signals, and multiplexers, however, it should be understood that many suitable ADCs (104) are available and known in the art. An output control block (105) may be configured to output the digital representations on one or more output lines or channels. The output control block (105) will be described in more detail below.

As shown in FIG. 1, the multi-channel ADC (100) may also include a user configuration block (106), a track-and-hold and integrate logic block (107), and a timing block (108). The user configuration block (106) may be used to program the multi-channel ADC (100) with one or more user-specific parameters. These parameters may control any aspect of the operation of the ADC (100) as best serves a particular application. The user configuration (106) may be provided to the track/hold and integrate logic (107) and thereafter stored in memory to be referenced by circuitry in the system (100) as needed. In some embodiments, the user configuration (106) may be dynamically obtained from a user throughout system operations.

The track-and-hold and integrate logic block (107) may include any combination of circuitry configured to control the operation of the track-and-hold blocks (102). The timing block (108) is configured to control the timing of the track-and-hold and integrate logic block (107) and or any other block within the ADC (100) as best serves a particular application. The track-and-hold integrate logic block (107) may be configured to selectively alter parameters of the track-and-hold blocks (102) such as integration time, sampling time, hold time, and combinations thereof.

In some examples, as mentioned previously, it may be desirable to vary the order in which each channel within the multi-channel ADC (100) is sampled. Additionally or alternatively, it may be desirable to sample two or more of the channels simultaneously. To this end, an input sequencer block (109) may be communicatively coupled to the track-and-hold and integrate logic block (107). The input sequencer block (109), as will be described in more detail below, may be configured to control the manner in which one or more of the channels of the ADC (100) are sampled and may include any combination of hardware, software, and/or firmware. For example, in some embodiments the input sequencer block (109) may be implemented as an application specific integrated circuit (ASIC), or as a microcontroller running custom firmware. In other embodiments, the input sequencer block (109) may be implemented in a field programmable gate array (FPGA) or as software running on hardware component. It will be recognized that the input sequencer block (109) may additionally or alternatively be communicatively coupled to the MUX (103) or to any other component within the ADC (100).

The input sequencer block (109) of the present example is configured to use parameters from the user configuration (106) to determine the sequencing and operation of the track-and-hold blocks (102), and the MUX (103). The user configuration may be received from another electronic component that interfaces with the user, or directly from the user. The user configuration may be received using any suitable protocol available. Examples of suitable protocols include, but are not limited to, serial peripheral interface (SPI), I²C, RS-232, and others.

In some examples, the input sequencer block (109) may operate according to one or more instructions contained within a programmable configuration table. FIG. 3 illustrates an exemplary programmable configuration table (130) that may be used to control the operation of the input sequencer block (109).

As shown in FIG. 3, each channel within the multi-channel ADC (100) may be assigned a column within the configuration table (130). For example, the configuration table (130) shown in FIG. 3 corresponds to an ADC (100) with four channels for illustrative purposes. The configuration table (130) may also include any number of rows as best serves a particular application. For example, four rows are shown in FIG. 3 for illustrative purposes only.

In some examples, each row within the configuration table (130) corresponds to a particular sampling scheme. Hence, a digital sequencing mechanism or program may be configured to cycle through each row and perform the specified sampling schemes contained therein. For example, the configuration table (130) shown in FIG. 3 is programmed to cause the multi-channel ADC (100) to sample each channel one time during the particular sampling scheme corresponding to Row 1. Because there is only one row with entries within the configuration table (130), the ADC (100) repeats the sampling scheme contained therein until otherwise instructed. Hence, all the channels are sampled at the same sampling rate.

FIG. 4 illustrates another exemplary programmable configuration table (130) in which three different sampling schemes are specified. As shown in FIG. 4, the sampling scheme specified in row 1 is configured to cause the ADC (100) to sample the first channel 249 times, the second channel one time, and then skip channels 3 and 4. The ADC (100) then performs the sampling scheme specified in row 2 by sampling the first channel 249 times, skipping the second channel, sampling the third channel one time, and then skipping the fourth channel. The sampling scheme specified in row 3 is then performed in a similar manner.

Once each sampling scheme as specified in rows 1-3 has been performed, the ADC (100) may be configured to cycle through the table (130) again until otherwise instructed. Hence, each sampling cycle specified by table (130) is 750 samples long, with the sampling rate for channel 1 being much higher than the sampling rates corresponding to channels 2-4. In the present example, channel 1 is sampled a total of 747 times in each cycle, while channels 2-4 are sampled only once in each cycle.

Figure 5:
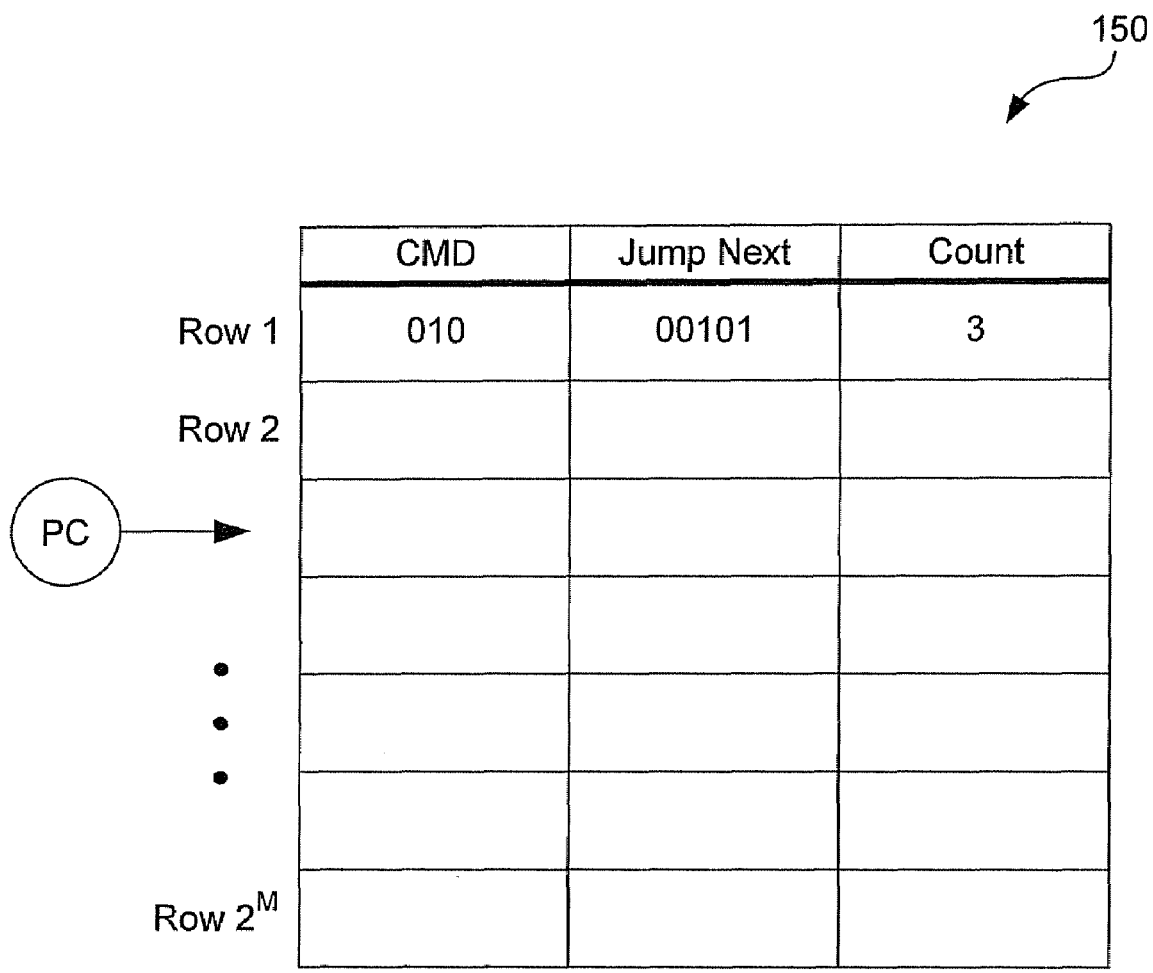
FIG. 5 illustrates an alternative type of programmable configuration table that that may be used to control the operation of the input sequencer block according to principles described herein.

FIG. 5 illustrates an alternative type of programmable configuration table (150) that may be used to control the operation of the input sequencer block (109). As shown in FIG. 5, the table may include a number of rows each containing various instructions regarding the operation of the input sequencer block (109). In some examples, each row or entry within the table may be treated as a step in a computer program.

As shown in FIG. 5, the configuration table (150) may include, for example, $2^m$ rows. Each row may include a command code, a jump next code, and a count code. In some examples, the command code may be configured to cause the ADC (100) to perform any action such as, but not limited to, sample a particular channel, operate in sleep mode, calibrate, pause, or stop.

FIG. 6 illustrates an exemplary mapping of control codes that may be used in connection with the configuration table (150) of FIG. 5. As shown in FIG. 6, each control code may correspond to a specific action. For example, the control code "000" may cause the ADC (100) to sample channel 1, the control code "001" may cause the ADC (100) to sample channel 2, and so forth. Various commands regarding the operation of the ADC (100) may additionally or alternatively be specified by one or more of the command codes, as shown in FIG. 6. For example, a command code may correspond to a sleep mode, a calibration mode, a pause mode, and a stop mode.

Returning to FIG. 5, the configuration table (150) may also include a "jump next" code. Each jump next code corresponds to an entry within the configuration table (150) and is configured to cause a program counter (PC) (151) to jump to a particular entry within the table (150) after the corresponding command is executed. Hence, each jump code may have m bits if there are $2^m$ rows within the table (150).

Each row within the configuration table (150) may also include a count code configured to specify the number of times a corresponding command is to be performed. For example, the command "010" shown in Row 1 is performed 3 times.

It will be recognized that the configuration tables described herein are merely illustrative and that they may be modified, added to, or otherwise varied as best serves a particular application.

Figure 7:
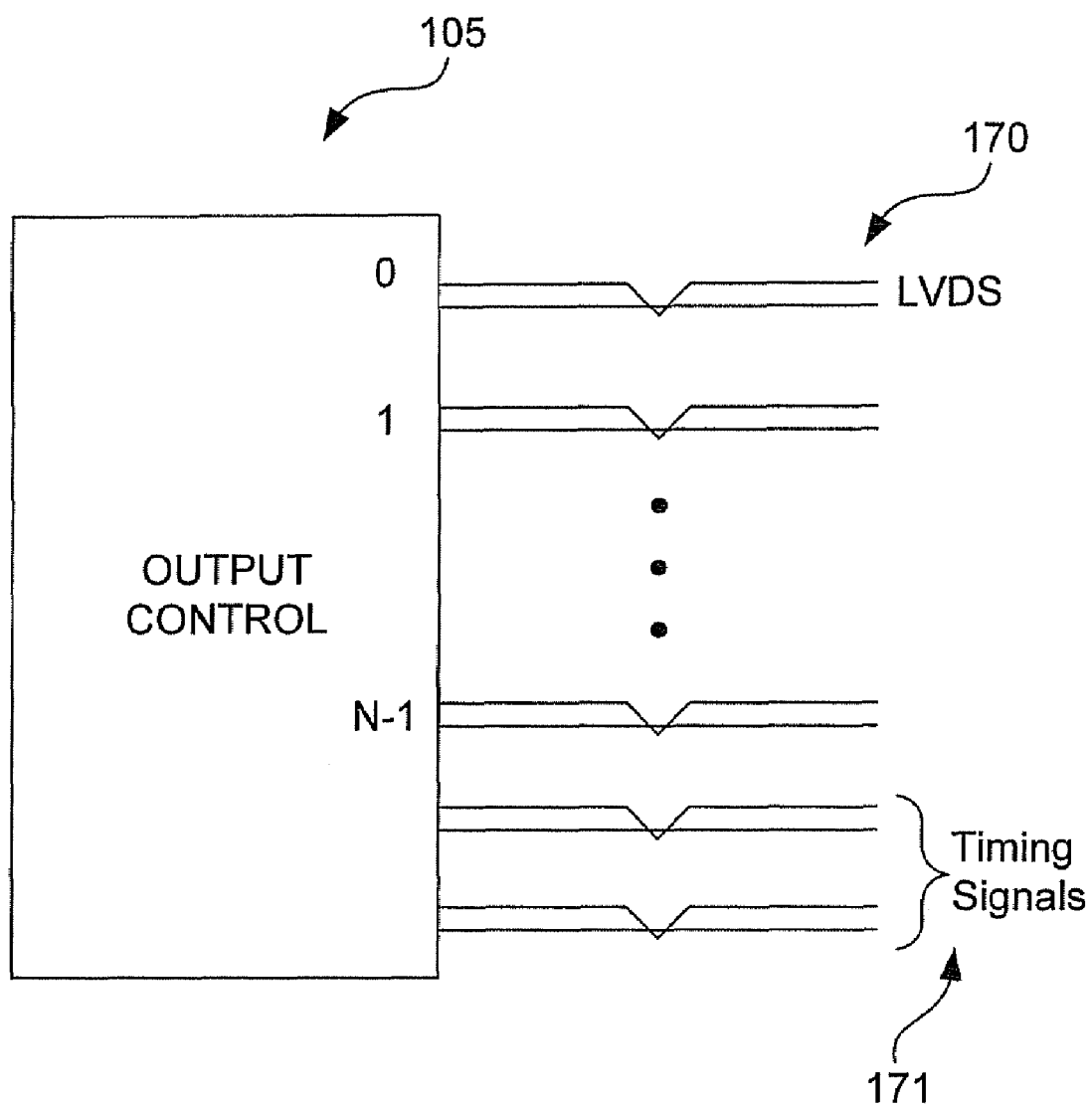
FIG. 7 illustrates an exemplary output control block configure to output one or more low voltage differential signaling (LVDS) outputs according to principles described herein.

As mentioned, the multi-channel ADC (100) may include an output control block (105) configured to control the manner in which the digital signals are output from the ADC (100). FIG. 7 illustrates an exemplary output control block (105) configure to output one or more low voltage differential signaling (LVDS) outputs (170). In some examples, the LVDS output signals (170) may be output faster than the actual bit sampling rate. It will be recognized that the output control block (105) shown in FIG. 7 is merely exemplary and that it may additionally or alternatively be configured to output information in any sequence and/or format as best serves a particular application.

Figure 8:
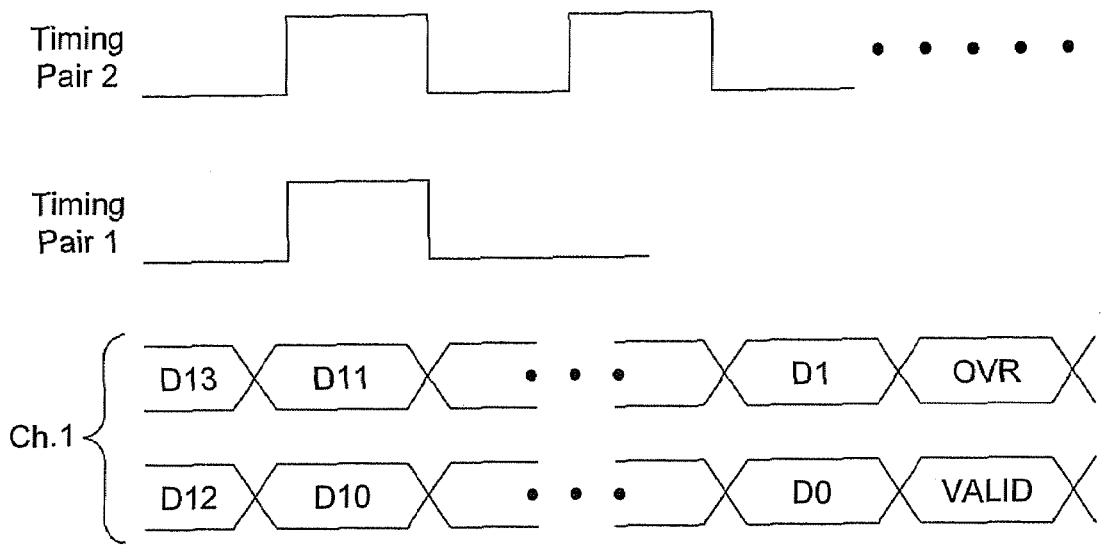
FIG. 8 is an example of a serialized LVDS output wherein two timing signals are used to facilitate the serial output of a particular channel on two pairs of wires according to principles described herein.

As shown in FIG. 7, one or more timing signals (171) may also be output by the output control block (105). The timing signals (171) may be used to facilitate the LVDS outputs (170). In some examples, one of the timing signals may be used to indicate when a particular sample is output on each pair of output wires. For example, if it is desirable for channel 1 to be output on only the first two pairs of LVDS outputs (170), the data may be output serially, as shown in the timing diagram of FIG. 8. FIG. 8 is an example of a serialized LVDS output wherein two timing signals (171) are used to facilitate the serial output of channel 1 on two pairs of wires. In some examples, bandwidth may be maximized by trading off how many parallel pairs versus serial bits are used.

The output control block (105) is programmatically configured to control a format in which data from the core ADC (104) is output to a data consumer. The data consumer may be another electronic component in communication with the output control block (105) The format may be determined by the user configuration (106) received, or by an electronic component in communication with the output control (105). In still other embodiments, the output control (105) may logically determine the most appropriate format for the data based on detected conditions in the data flow from the core ADC (104).

Examples of formats in which the data from the core ADC (104) is output to a data consumer include, but are not limited to, raw data streams from the core ADC (104), channel-specific data streams having embedded channel identifiers, separate concurrent streams of channel-specific data, time-multiplexed streams of channel-specific data, and combinations thereof. The word "channel" in this context refers to individual streams of data corresponding to individual track and hold blocks (102) or data corresponding to specific combinations of track and hold blocks (102).

The output control (105) may have a number of different output pins or channels, and the output control (105) may be configured to control the presentation and/or format of data provided to data consumers on each of the channels. In some embodiments the output channels may provide data having different formats to one or more consumers. Alternatively, in some embodiments, different output channels may provide data streams specific to data obtained from different track-and-hold blocks (102).

Figure 9:
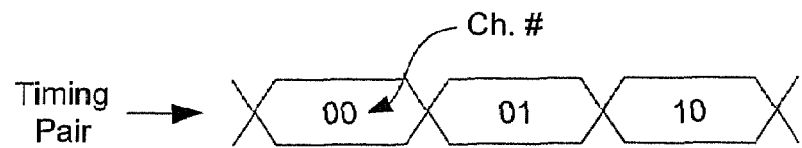
FIG. 9 illustrates an alternative example wherein the output control block between channels for parallel output according to principles described herein.

FIG. 9 illustrates an alternative example wherein the output control block (105) between channels for parallel output. As shown in FIG. 8, the one or more of the timing pairs may be used to specify which channel is to be output in parallel during a given time frame. Moreover, it will be recognized that the output control block (105) may be configured to change between parallel and serial output on the fly.

The systems and methods herein may be used in many different applications. For example, one particular application in which the multi-channel ADC (100) may be used is automatic test equipment configured to test different devices. In some examples, some devices have to be tested at a high sample rate while others at a low sample rate. A single multi-channel ADC (100) such as that described herein may be programmed to accommodate such a situation. Many different additional applications may also benefit from the systems and methods described herein.

The preceding description has been presented only to illustrate and describe embodiments of the invention. It is not intended to be exhaustive or to limit the invention to any precise form disclosed. Many modifications and variations are possible in light of the above teaching.

What is claimed is:

1. A system for multi-channel analog-to-digital conversion, comprising:
 a plurality of sampling modules, wherein each of said modules comprises an input node and an output node;
 multiplexing circuitry configured to selectively route at least one of a plurality of electrical signals present on said output nodes to an analog-to-digital converter; and
 control circuitry in communication with said multiplexing circuitry, wherein said control circuitry is programmable such that at least one of a sample timing of said analog-to-digital converter and a sequence in which said electrical signals are routed to said analog-to-digital converter is controlled by a program executed by said control circuitry.

2. The system of claim 1, wherein said control circuitry is programmatically configured to control said sequence in accordance with a programmable configuration table specifying an independent sampling rate and sequence for each said sampling module.

3. The system of claim 1, wherein said control circuitry is connected to said sampling modules, and said control circuitry is further configured to selectively activate said sampling modules according to said sequence.

4. The system of claim 1, wherein said sampling modules comprise track and hold circuitry.

5. The system of claim 4, wherein said control circuitry is further configured to selectively alter parameters of said sampling modules that are selected from the group consisting of: integration time, sampling time, hold time, and combinations thereof.

6. The system of claim 1, wherein said analog-to-digital converter is selected from the group consisting of: voltage mode analog-to-digital converters, current mode analog-to-digital converters, and combinations thereof.

7. The system of claim 1, wherein said sampling modules comprise a filter selected from the group consisting of: low pass filters, band pass filters, and high pass filters.

8. A system for multi-channel analog-to-digital conversion, comprising:
 a plurality of sampling modules, wherein each of said modules comprises an input node and an output node;
 multiplexing circuitry configured to selectively route at least one of a plurality of electrical signals present on said output nodes to an analog-to-digital converter; and
 output circuitry in communication with an output of said analog-to-digital converter, wherein said output circuitry is programmatically configured to control a format in which data from said analog-to-digital is output to a data consumer;
 wherein said output circuitry is programmatically configured to output said data in a format determined by user input.

9. The system of claim 8, wherein said output circuitry is programmatically configured to output said data as differential voltage signals.

10. The system of claim 9, wherein said output circuitry is further configured to output timing signals.

11. The system of claim 8, wherein said format is selected from the group consisting of: raw data streams from said analog-to-digital converter, channel-specific data streams having embedded channel identifiers, separate concurrent streams of channel-specific data; time-multiplexed streams of channel-specific data; and combinations thereof.

12. A system for multi-channel analog-to-digital conversion, comprising:
 a plurality of sampling modules, wherein each of said modules comprises an input node and an output node;
 multiplexing circuitry configured to selectively route at least one of a plurality of electrical signals present on said output nodes to an analog-to-digital converter; and
 output circuitry in communication with an output of said analog-to-digital converter, wherein said output circuitry is programmatically configured to control a format in which data from said analog-to-digital is output to a data consumer;
 wherein said output circuitry comprises a plurality of output channels, wherein said output circuitry is further programmatically configured control said format for each of said output channels.

13. The system of claim 12, wherein different output channels comprise data having different formats.

14. The system of claim 12, wherein different output channels comprise data streams specific to different sampling modules.

15. The system of claim 8, wherein said data consumer is another electronic component.

16. The system of claim 8, wherein said analog-to-digital converter is selected from the group consisting of: voltage mode analog-to-digital converters, current mode analog-to-digital converters, and combinations thereof.

17. A method of multi-channel analog to digital conversion, comprising:
 providing a plurality of analog inputs; and
 programmatically controlling wherein each of said analog inputs is sampled by an analog-to-digital converter in response to user input.

18. The method of claim 17, wherein said user input is stored in memory.

19. The method of claim 17, wherein said user input is dynamically obtained from a user.

20. The method of claim 17, further comprising selectively routing an output signal from said analog-to-digital converter to at least one of a plurality of output channels in response to said user input.

21. The method of claim 17, further comprising selectively formatting an output signal from said analog-to-digital converter in response to said user input.

* * * * *